(12) United States Patent  
Lee et al.

(10) Patent No.: US 8,305,831 B2
(45) Date of Patent: Nov. 6, 2012

(54) POWER MANAGEMENT

(75) Inventors: Cheng Hung Lee, Hsinchu (TW); Chung-Yi Wu, Taipei (TW); Hsu-Shun Chen, Toufen Town (TW); Chung-Ji Lu, Fongyuan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 135 days.

(21) Appl. No.: 12/885,826

(22) Filed: Sep. 20, 2010

(65) Prior Publication Data

US 2011/0090753 A1 Apr. 21, 2011

Related U.S. Application Data

(60) Provisional application No. 61/251,947, filed on Oct. 15, 2009.

(51) Int. Cl.
*G11C 5/14* (2006.01)
(52) U.S. Cl. .......... 365/229; 365/226; 365/227
(58) Field of Classification Search .......... 365/226, 365/227, 229
See application file for complete search history.

(56) References Cited

U.S. PATENT DOCUMENTS

| | | | |
|---|---|---|---|
| 6,414,895 B2 * | 7/2002 | Kokubo et al. | 365/227 |
| 6,535,421 B1 * | 3/2003 | Ozawa | 365/185.09 |
| 2005/0094474 A1 * | 5/2005 | Deng et al. | 365/229 |
| 2005/0162943 A1 * | 7/2005 | Koelling et al. | 365/189.11 |
| 2005/0185450 A1 * | 8/2005 | Isoda et al. | 365/154 |
| 2006/0002223 A1 * | 1/2006 | Song et al. | 365/226 |
| 2006/0170403 A1 * | 8/2006 | Im | 323/280 |
| 2008/0080271 A1 * | 4/2008 | Kim | 365/194 |
| 2008/0094920 A1 * | 4/2008 | Hsu et al. | 365/189.09 |
| 2011/0261629 A1 * | 10/2011 | Seshadri et al. | 365/189.09 |
| 2011/0261632 A1 * | 10/2011 | Clinton et al. | 365/189.14 |

* cited by examiner

*Primary Examiner* — Hoai V Ho
*Assistant Examiner* — Jay Radke
(74) *Attorney, Agent, or Firm* — Lowe Hauptman Ham & Berner, LLP

(57) ABSTRACT

An SRAM includes circuitry configured for the SRAM to operate at different operation modes using different voltage levels wherein the voltage level and thus the supply current leakage is regulated based on the operation mode. For example, the SRAM, in a normal operation mode, consumes power as other SRAMs. In a deep sleep mode the supply voltage (e.g., VDDI) for the bit cell in the SRAM macro is lowered by about 20-40% of the SRAM supply voltage (e.g., VDD), sufficient to retain the data in the bit cell. When access to the SRAM is not needed, the SRAM operates in the sleep mode, consuming little or no power.

22 Claims, 4 Drawing Sheets

POWER MANAGEMENT

CROSS-REFERENCE TO RELATED APPLICATIONS

The present application claims priority of U.S. Provisional Patent Application Ser. No. 61/251,947, filed on Oct. 15, 2009, which is incorporated herein by reference in its entirety.

TECHNICAL FIELD

The present disclosure is generally related to circuit power management. Various embodiments provide mechanisms to regulate voltage supply in different modes of operation of an SRAM.

BACKGROUND

Current leakage in SRAM varies depending on its supply voltage. In various approaches using SRAM the internal supply voltage (e.g., VDDI) for an SRAM macro is equal to the SRAM supply voltage (e.g., VDD) minus the voltage drop across a diode (e.g., voltage Vdiode). Voltage Vdiode, however, is affected by temperature (e.g., temperature T) and the current flowing through the diode (e.g., current I), in which current I and thus the leakage current increase exponentially with respect to temperature increase. Voltage Vdiode also varies depending on the technologies and the size of the transistor forming the diode, making it complicated to determine voltage Vdiode to be used in various applications. These approaches, additionally, cannot track variations in manufacturing process used to build the SRAM cell.

BRIEF DESCRIPTION OF THE DRAWINGS

The details of one or more embodiments are set forth in the accompanying drawings and the description below. Other features and advantages of the disclosure will be apparent from the description, drawings, and claims.

Like reference symbols in the various drawings indicate like elements.

DETAILED DESCRIPTION

Figure 1:
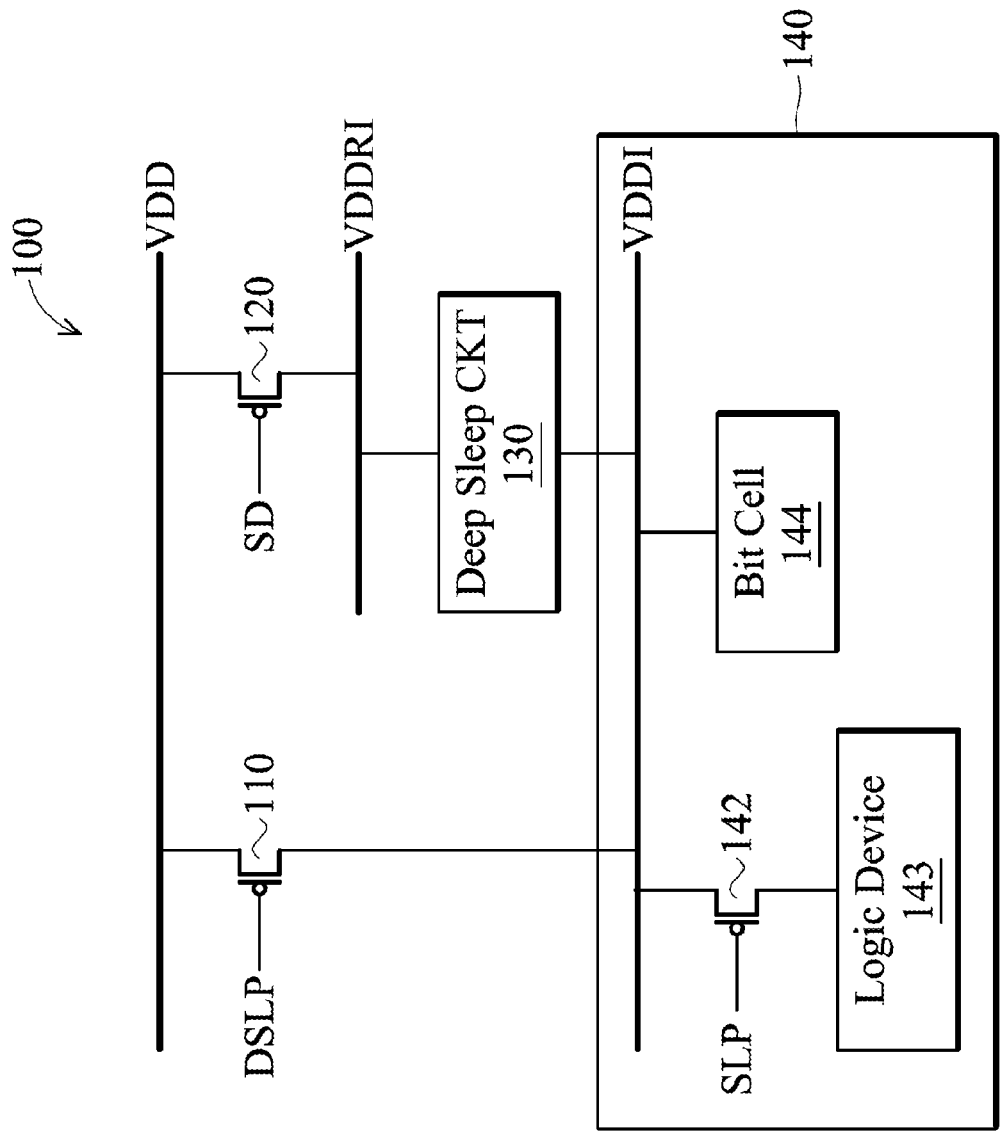
FIG. 1 shows an SRAM, in accordance with an embodiment.

Embodiments or examples illustrated in the drawings are described below using specific language. It will nevertheless be understood that no limitation of the scope of the invention is thereby intended. Any alterations and modifications in the described embodiments, and any further applications of principles of the invention described in this document are contemplated as would normally occur to one of ordinary skill in the art to which the invention relates. Reference numbers may be repeated throughout the embodiments, but this does not necessarily require that feature(s) of one embodiment apply to another embodiment, even if they share the same reference number.

SRAM

1st Embodiment

FIG. 1 shows a first exemplary SRAM 100 in accordance with an embodiment. SRAM 100 is used for illustration, but other circuitry including volatile memory (e.g., flip flop or the like) is within the scope of various embodiments. Voltage VDD is the supply voltage for SRAM 100. Voltage VDDRI is the supply voltage for deep sleep circuit 130, and voltage VDDI is the supply voltage for SRAM macro 140. Voltage VDDI takes power from voltage VDD through transistor 110 or through transistor 120, voltage VDDRI, and deep sleep circuit 130. For example, when transistor 110 is on, voltage VDDI, through transistor 110, takes power from voltage VDD. In an embodiment, voltage VDDI is substantially equal to voltage VDD in such a configuration. When transistor 110 is off, the signal path from voltage VDD to voltage VDDI is cut off. When transistor 120 is on, voltage VDD is passed to voltage VDDRI and thus to voltage VDDI. When transistor 120 is off, voltage VDDRI is floating, the power path from voltage VDD to voltage VDDI is cut off. Signals DSLP, SD and SLP control (e.g., turn on/off) transistors 110, 120, and 142, respectively. For example, when signal DSLP is activated (e.g., at a low voltage level (a Low)), transistor 110 is turned on, and when signal DSLP is de-activated (e.g., at a high voltage level (a High)), transistor 110 is turned off. When signal SD is activated (e.g., at a Low), transistor 120 is turned on, and when signal SD is de-activated (e.g., at a High), transistor 120 is turned off, etc.

In various embodiments, SRAM 100 operates in the normal, sleep, and deep sleep modes in which the supply power (e.g., voltage VDDI) for SRAM macro 140 varies in each of the modes. In the normal operation mode (e.g., the active mode) SRAM 100 operates as usual, e.g., both reading from and writing to bit cell 144 is available. At that time transistor 120 is off, which turns off deep sleep circuit 130, and transistor 110 is on such that supply voltage VDD is transferred to internal voltage VDDI. In the active mode, logic device 143 may be turned on or off by transistor 142. For example, when signal SLP is activated (e.g., at a Low), transistor 142 is turned on, which, in turn, turns on logic device 143. When signal SLP is deactivated (e.g., at a High), transistor 142 is turned off, which in turn turns off logic device 143.

In the deep sleep mode, deep sleep circuit 130 acts as a regulator regulating voltage VDDI from voltage VDD. In an embodiment, voltage VDDI is reduced by about 20-40% of the SRAM supply voltage VDD, which is sufficient to retain the data content in bit cell 144 for cost effective. Further, reducing the voltage level of voltage VDDI is based on configuration of deep sleep circuit 130. In the deep sleep mode, transistor 110 is off, cutting off the power path from voltage VDD through transistor 110 to voltage VDDI. At the same time, transistor 120 is on allowing supply voltage VDD to pass through voltage VDDRI and consequently turning on deep sleep circuit 130. In an embodiment, voltage VDDRI is substantially the same as voltage VDD.

In the sleep mode, access to SRAM macro 140 or data in bit cell 144 is not available, resulting in little or no power being consumed and no current leakage being incurred. In this situation, both transistors 110 and 120 are off, the power supply paths from voltage VDD to voltage VDDI are cut off.

Logic device 143 includes periphery or logic circuits for use by SRAM macro 140, including, for example, combinatorial circuits such as NAND, NOR gates, inverters, etc. Bit cell 144 stores data for SRAM macro 140. In various embodiments, the manufacturing process for logic device 143 and for other memory elements (e.g., bit cell 144) differ in which the memory process (e.g., SRAM process) includes implant different from that of logic device 143. As a result, current leakage originates from both the logic process leakage and the SRAM process leakage. Depending on applications, transistors built by the logic manufacturing process may have higher driving capabilities than transistors built by the memory manufacturing process. Further, a device built by a logic process may be slower or faster than the same device built by an SRAM process. As a result, a logic process may form transistors that are slower or faster than those formed by an SRAM process. Some embodiments provide both logic diodes 220 (FIG. 2) and SRAM diodes 210 (FIG. 2) to compensate for both the logic process leakage and the SRAM process leakage.

Deep Sleep Circuit

Figure 2:
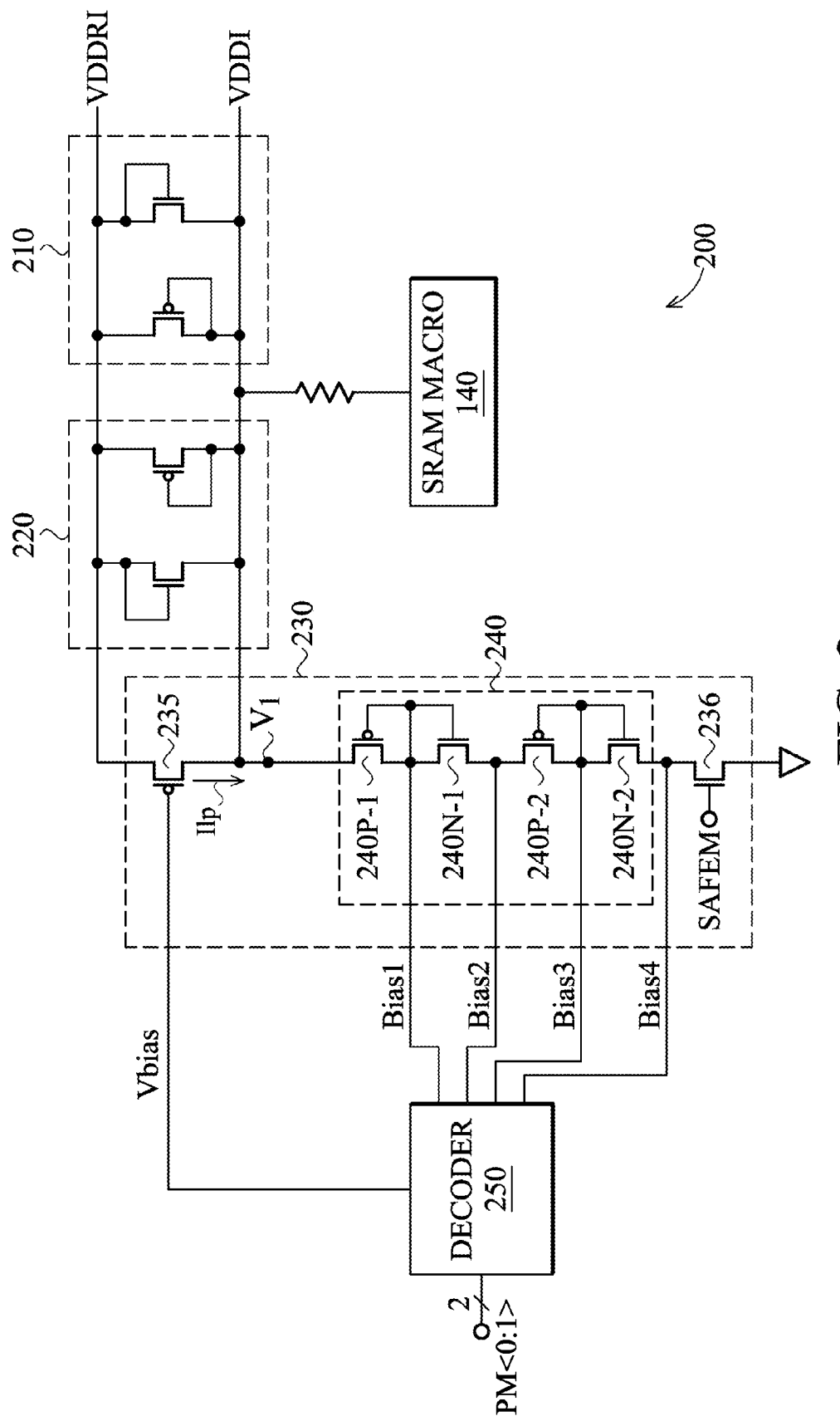
FIG. 2 shows a deep sleep circuit of the SRAM in FIG. 1, in accordance with an embodiment.

FIG. 2 shows a circuit 200 illustrating an embodiment of deep sleep circuit 130, which may be referred to as a voltage regulation circuit, a power saving circuit, etc. Deep sleep circuit 200 includes voltage regulators 210 and 220 having transistors configured to function as diodes (i.e., diode-connected transistors). The NMOS transistors configured as diodes are referred to as NMOS diodes in the present application, and the PMOS transistors configured as diodes are referred to as PMOS diodes. Furthermore, the diodes built using a logic process are referred to as logic diodes, and the diodes built using an SRAM process are referred to as SRAM diodes. These transistors are NMOS and/or PMOS built by a logic process and a memory (e.g., SRAM) process. Generally, NMOS diodes track and thus compensate current leakages for NMOS transistors. PMOS diodes track and compensate for PMOS transistors. Further, logic diodes track and compensate for devices built by logic process, and SRAM diodes track and compensate for devices built by SRAM process. For example, NMOS SRAM diodes track and thus compensate for NMOS transistors in bit cell 144, and PMOS SRAM diodes track and thus compensate for PMOS transistors in bit cell 144. Similarly, NMOS logic diodes track and compensate for NMOS transistors in logic device 143 and PMOS logic diodes track and compensate for PMOS transistors in logic device 143. FIG. 2 shows a pair of transistors including an NMOS SRAM diode and a PMOS SRAM diode in block 210 and a pair of transistors including an NMOS logic diode and a PMOS logic diode in block 220 for illustration, but various embodiments are applicable to various numbers of NMOS and PMOS diodes for both logic and SRAM processes. The number of SRAM diodes in voltage regulator 210 and logic diodes in voltage regulator 220 being used in deep sleep circuit 200 depends on various factors including, for example, the size of the transistors forming the diodes, the size of SRAM macro 140, the ratio between the number of transistors used in logic device 143 to the number of transistors used in bit cells 144, etc. Because SRAM diodes in voltage regulator 210 track RAM cell process variations and logic diodes in voltage regulator 220 track logic process variations, SRAM diodes in voltage regulator 210 and logic diodes in voltage regulator 220 enable effective process corner coverage, i.e., coverage for different speed (e.g., slow process, fast process), different implant types (e.g., N-implant or NMOS, P-implant or PMOS, etc.), and different process types (e.g., SRAM process, logic process, etc.) of devices. Diodes in voltage regulators 210 and 220 are shown at the boundary of deep sleep circuit 200 for illustration, but they can be at different locations. FIG. 2 shows transistors in voltage regulators 210 and 220 configured as diodes for illustration, but various embodiments may use diodes, instead of transistors configured as diodes. Implementing diodes or transistors configured as diodes is based on design choices considering various factors including, for example, the layout areas taken by the underlying device (e.g., transistors/diodes), the voltage variations of the devices, etc.

Transistors in regulators 210 and 220 may be considered as circuitry regulating voltage VDD to voltage VDDI. This is because transistors in regulators 210 and 220 being configured as diodes provide a predictable voltage drop from voltage VDD to voltage VDDI. In an embodiment, a desired voltage VDDI (e.g., the voltage sufficient to retain data in bit cell 144) is determined, the voltage drop from voltage VDD to the desired voltage VDDI is calculated, and the size and configuration of transistors in regulators 210 and 220 are selected to provide this calculated voltage drop. Depending on applications and/or technologies, voltage VDDI may be determined as about 40-60% of voltage VDD. Selecting transistors in regulators 210 and 220 (e.g., their size, configuration, etc.) also considers the amount of current sufficient to support the desired voltage VDDI. In this aspect, transistors in regulators 210 and 220 may be considered current sources providing current to support voltage VDDI. Transistors in regulators 210 and 220 are used for illustration, other circuitry (e.g., diodes, voltage regulators, current sources, etc.) providing equivalent functions (e.g., regulating the voltage, providing the desired current, etc.) is within the scope of various embodiments of the invention.

NMOS transistor 236 controls (e.g., turns on/off) self-compensation circuit 230. For example, if signal SAFEM is activated (e.g., at a High), it turns on transistor 236 to provide the current path for self-compensation circuit 230 and thus turns circuit 230 on. But if signal SAFEM is de-activated (e.g., at a Low), it turns off transistor 236, cutting off the current path and thus turns off self-compensation circuit 230.

Self-compensation circuit 230 stabilizes supply voltage VDDI. Circuit 230 behaves as a negative feedback and tracks voltage supply VDDI, and could be built by an SRAM process or by a logic process. Voltage Vbias controls logic transistor 235. The term "logic" referring to transistor 235 indicates that transistor 235 is built from the logic process in the embodiment of FIG. 2. Transistor 235, however, may be built from a different process (e.g., a SRAM process). Voltage Vbias, logic transistor 235, and selected bias voltages Bias1, Bias2, Bias3, and/or Bias4 form the self-compensation loop for circuit 230. If voltage VDDI increases, the selected bias voltages also increase, which provides logic transistor 235 with a higher biasing voltage Vbias. As a result, current Ilp decreases causing the selected bias voltages to decrease and thus biasing voltage Vbias and voltage VDDI to decrease. But if voltage VDDI decreases, the selected bias voltages and biasing voltage Vbias decrease, and thus causes current Ilp to increase, which increases voltage VDDI. Consequently, voltage VDDI is stabilized, which is advantageous over other approaches.

Transistors 240 act as resistive devices and function as part of a voltage divider for voltage VDDI and the selected bias voltages (for example, voltage Bias1). Depending on applications, in some embodiments, at least one NMOS transistor and one PMOS transistor are connected as diodes and are coupled in series. FIG. 2 shows two pairs of NMOS and PMOS transistors representing transistors 240 to correspond to four bias voltages Bias1, Bias2, Bias3, and Bias4, but the number of these transistors varies depending on the number of bias voltages. In an embodiment, bias voltage Bias1 is about 50% of voltage V1 and bias voltage Bias2, where voltage V1 is the voltage at the drain of PMOS transistor 240P-1, bias voltage Bias1 is the voltage at the source of PMOS transistor 240P-1 (or the source of NMOS transistor 240N-1), and bias voltage Bias2 is the voltage at the drain of NMOS transistor 240N-1. Similarly, bias voltage Bias3 is about 50% of bias voltage Bias2 and bias voltage Bias4, where bias voltage Bias2 is the voltage at the drain of PMOS transistor 204P-2; bias voltage Bias3 is the voltage at the source of PMOS transistor 240P-2 (or the source of NMOS transistor 240N-2); and bias voltage Bias4 is the voltage at the drain of NMOS transistor 240N-2. FIG. 2 shows transistors 240 for illustration, but circuitry performing equivalent functions (e.g., providing appropriate resistance) is within the scope of various embodiments.

Decoder circuitry 250 functioning as a multiplexer selects the desired bias voltages Bias1, Bias2, Bias3, and/or Bias4, etc. Because the embodiment of FIG. 200 uses four bias voltages Bias1, Bias2, Bias3, and Bias4, two signals PM<0> and PM<1> are used to decode and select those four bias voltages. But if the number of bias voltages changes, the number of signals PM<0:1> also changes as known by a person of ordinary skill in the art. For, example, if there are 5-8 bias voltages, there would be 3 signals PM<0:2>, and if there are 9-16 bias voltages, there would be 4 signals PM<0:3>, etc. In an embodiment, only one bias voltage (e.g., any one of voltages Bias1, Bias2, Bias3, or Bias4) is selected using selected signals PM<0:1>. Further, data is collected and a corresponding bias voltage (e.g., voltage Bias1, Bias2, Bias3, or Bias4) is determined based on that data for a desired voltage VDDI, and signals PM<0:1> are configured to select such bias voltage. Additionally, signals PM<0:1> are accessible from outside the chip embodying SRAM 100, which is advantageous to select a desired bias voltage as appropriate.

SRAM

2$^{nd}$ Embodiment

Figure 3:
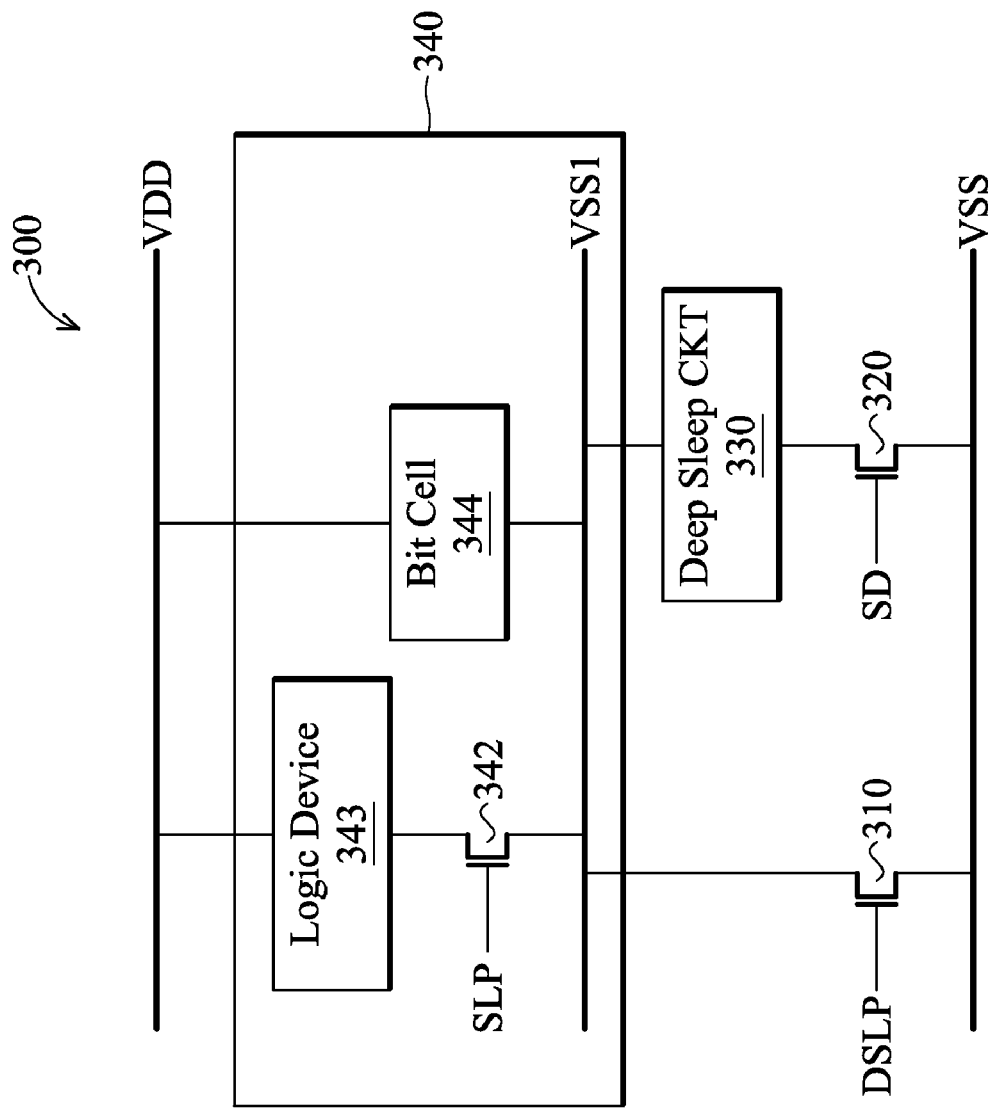
FIG. 3 shows a variation of the SRAM in FIG. 1, in accordance with an embodiment.

FIG. 3 shows an SRAM 300 in accordance with an embodiment. SRAM 300 includes circuitry comparable to circuitry in SRAM 100 such that SRAM 300 functions comparably to SRAM 100. For example, compared with SRAM 100, SRAM 300 includes transistors 310, 320, deep sleep circuit 330, SRAM macro 340, transistor 342, logic device 343, and bit cell 344 comparable to transistors, 110, 120, deep sleep circuit 130, SRAM macro 140, transistor 142, logic device 143, and bit cell 144. Unlike deep sleep circuit 130 that is coupled between voltage VDD and SRAM macro 140, deep sleep circuit 330, however, is coupled between SRAM macro 340 and voltage VSS. Further, voltages VSSRI and VSS are analogous to voltages VDDRI and VDDI in FIG. 1. Because of the different configuration of deep sleep circuit 330 as compared to deep sleep circuit 130, circuitry in SRAM 300 (e.g., transistors 310, 320, logic device 343, bit cell 342, etc.) is configured accordingly and can be recognizable by a person of ordinary skill in the art after reading this disclosure.

Figure 4:
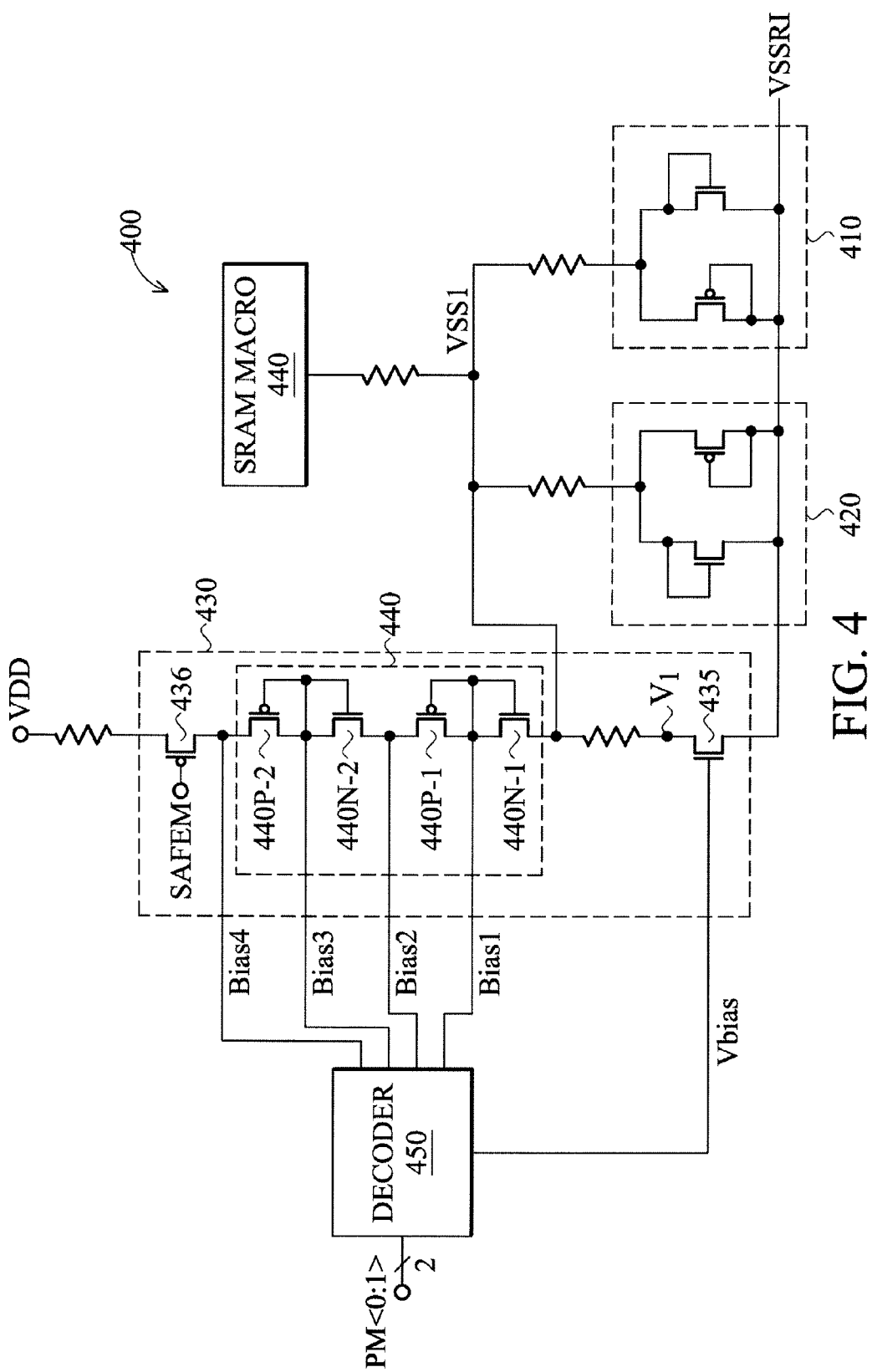
FIG. 4 shows a deep sleep circuit of the SRAM in FIG. 3, in accordance with an embodiment.

FIG. 4 shows circuit 400 illustrating deep sleep circuit 330, in accordance with an embodiment. Deep sleep circuit 330 includes circuitry comparable to circuitry in deep sleep circuit 130 such that deep sleep circuit 330 functions in SRAM 300 comparably to deep sleep circuit 130 functions in SRAM 100, which can be recognizable by a person of ordinary skill in the art after reviewing this disclosure. For example, deep sleep circuit 330 includes regulator 410 having SRAM diodes, regulator 420 having logic diodes, self-compensation circuit 430, and decoder circuitry 450 comparable to regulator 210 having SRAM diodes, regulator 220 having logic diodes, self-compensation circuit 230, and decoder circuitry 250. In self-compensation circuit 430 transistors 440, logic transistor 435 and transistor 436 are comparable to transistors 240, logic transistor 235 and transistor 236. Further, because of the different configuration of deep sleep circuit 330, circuitry in deep sleep circuit 330 is configured accordingly and can be recognizable by a person of ordinary skill in the art after reviewing this disclosure.

A number of embodiments of the invention have been described. It will nevertheless be understood that various modifications may be made without departing from the spirit and scope of the invention. For example, various transistors are shown to be NMOS and some others are shown to be PMOS, but various embodiments of the invention are not limited to such a configuration because selecting a transistor type (e.g., NMOS or PMOS) is a matter of design choice based on need, convenience, etc. Various embodiments of the invention are applicable in variations and combinations of transistor types. Further, some signals are illustrated with a particular logic level to operate some transistors, but selecting such levels and transistors are also a matter of design choice, and various embodiments of the invention are applicable in various design choices. Electronic components in conjunction with corresponding voltage and current are shown to perform a certain function for illustration, but similar components and/or circuitry may be used to perform the intended functions, and various embodiments of the invention are not limited to a particular component, circuit, or arrangement.

What is claimed is:

1. A memory comprising:
    a first supply voltage node;
    a memory macro comprising bit cells and at least one logic device;
    a first circuit coupled to the memory macro, the first circuit comprising:
        a first regulator built from a first manufacturing process; and
        a second regulator built from a second manufacturing process different from the first manufacturing process;
    a first device coupled to the first supply voltage node and to the first circuit; and
    a second device coupled to the first supply voltage node and to the memory macro,
    wherein a second supply voltage node of the memory macro is configured to selectively receive power from the first supply voltage node through the first circuit and the first device, or through the second device, and
    the memory is configured to satisfy at least one of the following conditions:
    (1) the first regulator comprises:
        a first N-type device; and
        a first P-type device, wherein the first N-type device and the first P-type device are built from the first manufacturing process and configured to compensate for the bit cells; and
    (2) the second regulator comprises:
        a second N-type device; and
        a second P-type device, wherein the second N-type device and the second P-type device are built from the second manufacturing process and configured to compensate for the at least one logic device.

2. The memory of claim 1 wherein the memory macro comprises a third device configured to control the at least one logic device in the memory macro.

3. The memory of claim 1, wherein the memory is configured to satisfy at least one of the following conditions:

(1) the first regulator comprises a first diode, a first transistor configured as the first diode, or a first voltage regulator; and (2) the second regulator comprises a second diode, a second transistor configured as the second diode, or a second voltage regulator.

4. The memory of claim 1 further comprising a second circuit configured to stabilize the second supply voltage node.

5. The memory of claim 4 wherein the second circuit comprises:
   a transistor coupled to the second node;
   a first voltage node having a first voltage configured to control the transistor; and
   a second voltage node having a second voltage configured to control a current flowing through the transistor and through one or a combination of a P-type device and an N-type device,
   wherein the transistor, the first voltage and the second voltage are configured to increase the second supply voltage when the second supply voltage decreases and to decrease the second supply voltage when the second supply voltage increases.

6. The memory of claim 5 wherein a signal configured to control selection of the second voltage is from outside of a chip embodying the memory.

7. The memory of claim 1 being a volatile memory.

8. A circuit comprising:
   a first voltage regulator manufactured by a first process and having a first first-regulator terminal coupled to a first node and a second first-regulator terminal coupled to a second node;
   a second voltage regulator manufactured by a second process different form the first process and having a first second-regulator terminal coupled to the first node and a second second-regulator terminal coupled to the second node; and
   a self-compensation circuit coupled to the second node and configured to stabilize a supply voltage at the second node,
   wherein the circuit is configured to satisfy at least one of the following conditions:
   (1) the first voltage regulator comprises:
      a first N-type device; and
      a first P-type device, wherein the first N-type device and the first P-type device are manufactured by the first process and configured to compensate for a first device manufactured by the first process; and
   (2) the second voltage regulator comprises:
      a second N-type device; and
      a second P-type device, wherein the second N-type device and the second P-type device are manufactured by the second process and configured to compensate for a second device manufactured by the second process.

9. The circuit of claim 8 wherein one or a combination of the first voltage regulator and the second voltage regulator includes a diode or a transistor configured as the diode.

10. The circuit of claim 8 wherein the first voltage regulator is configured to compensate for current leakage in the first device manufactured by the first process, and the second voltage regulator is configured to compensate for current leakage in the second device manufactured by the second process.

11. The circuit of claim 8 wherein the self-compensation circuit is configured to decrease the supply voltage when the supply voltage increases and to increase the supply voltage when the supply voltage decreases.

12. The circuit of claim 8 wherein the supply voltage is calculated based on a size of one or a combination of the first voltage regulator and the second voltage regulator.

13. A memory comprising:
   a first circuit comprising:
      a first N-type device;
      a first P-type device, wherein the first N-type device and the first P-type device are built from a first manufacturing process;
      a second N-type device; and
      a second P-type device, wherein the second N-type device and the second P-type device are built from a second manufacturing process different from the first manufacturing, and
   wherein
      the first N-type device, the first P-type device, the second N-type device, and the second P-type devices are coupled in parallel between a first node and a second node; and
      the first circuit is configured for the memory to operate in a first mode using a first level of supply voltage at the second node and in a second mode using a second level of supply voltage at the second node; the first level of supply voltage different from the second level of supply voltage.

14. The memory of claim 13 wherein the first circuit further comprising a second circuit configured to increase a supply voltage at the second node when the supply voltage decreases and to decrease the supply voltage when the supply voltage increases.

15. The memory of claim 13 wherein the second circuit includes:
   a device;
   a first voltage node having a first voltage configured to control the device; and
   a second voltage node having a second voltage;
   wherein the device, the first voltage, and the second voltage are configured to decrease a supply voltage at the second node when the first supply voltage increases and to increase the supply voltage when the supply voltage decreases.

16. The memory of claim 15 wherein the second voltage is used to control a resistive device coupled to the device.

17. The memory of claim 16 wherein the resistive device is formed by at least a P-type transistor or an N-type transistor.

18. The memory of claim 15 wherein the second voltage is selected by a signal from outside a chip embodying the memory.

19. The memory of claim 15 wherein the second voltage is used to control a current flowing through the device.

20. The memory of claim 13 further comprising a device coupled to the first node and configured for the memory to operate in the first mode or in the second mode.

21. The memory of claim 13 further comprising:
   a memory macro;
   a first device coupled between a voltage supply node and the first circuit; and
   a second device coupled between the voltage supply node and the memory macro.

22. The memory of claim 13 wherein the second level of supply voltage is based on a size of one or a combination of the first N-type device, the first P-type device, the second N-type device, and the second P-type device.

* * * * *